(12) United States Patent
Bartley et al.

(10) Patent No.: US 8,174,103 B2
(45) Date of Patent: May 8, 2012

(54) ENHANCED ARCHITECTURAL INTERCONNECT OPTIONS ENABLED WITH FLIPPED DIE ON A MULTI-CHIP PACKAGE

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew Benson Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 12/113,389

(22) Filed: May 1, 2008

(65) Prior Publication Data
US 2009/0273098 A1  Nov. 5, 2009

(51) Int. Cl.
*H01L 23/02* (2006.01)
(52) U.S. Cl. .................... 257/685; 257/E25.01
(58) Field of Classification Search .......... 257/621, 257/774, 777, 685, 723–724, E25.01, E25.011, 257/E25.012
See application file for complete search history.

(56) References Cited

U.S. PATENT DOCUMENTS

| | | | |
|---|---|---|---|
| 5,399,898 A | 3/1995 | Rostoker | |
| 6,268,660 B1 | 7/2001 | Dhong et al. | |
| 6,441,479 B1 * | 8/2002 | Ahn et al. | 257/700 |
| 6,917,100 B2 * | 7/2005 | Chennupati | 257/686 |
| 7,462,509 B2 * | 12/2008 | Bernstein et al. | 438/107 |
| 7,477,535 B2 * | 1/2009 | Lahtinen et al. | 365/51 |
| 7,564,118 B2 * | 7/2009 | Pogge et al. | 257/621 |
| 7,629,675 B2 * | 12/2009 | Briggs et al. | 257/666 |
| 2003/0128522 A1 * | 7/2003 | Takeda et al. | 361/715 |
| 2005/0212406 A1 * | 9/2005 | Daniels et al. | 313/503 |
| 2005/0275088 A1 * | 12/2005 | Sakurai et al. | 257/723 |
| 2006/0238326 A1 * | 10/2006 | Repetto et al. | 340/461 |
| 2008/0080163 A1 * | 4/2008 | Grote, III et al. | 362/23 |
| 2008/0220565 A1 * | 9/2008 | Hsu et al. | 438/109 |
| 2008/0293186 A1 * | 11/2008 | Hao et al. | 438/109 |
| 2009/0016088 A1 * | 1/2009 | Bayerer et al. | 363/125 |
| 2009/0020855 A1 * | 1/2009 | Pyeon | 257/621 |

OTHER PUBLICATIONS

IBM U.S. Appl. No. 11/833,112, filed Aug. 2 2007, entitled "Small Area, Robust Silicon Via Structure and Process", Paul S. Andry, et al.
"3D Chip Stacking Technology with Low-Volume Lead-Free Interconnections" K Sakuma et al. Electronic Components and Technology Conference 2007 ECTC '07 Proceedings 57th, May 29-Jun. 1, 2007, pp. 627-632.

* cited by examiner

*Primary Examiner* — Matthew W Such
*Assistant Examiner* — Ali Naraghi
(74) *Attorney, Agent, or Firm* — Robert R. Williams

(57) ABSTRACT

A particular chip is designed having a first variant (front side connected chip) of the chip and a second variant (back side connected chip). The first variant of the chip is attached to a carrier. The second variant of the chip is attached to the carrier inverted relative to the first variant of the chip. The first and second variants of the chip are attached to the carrier such that a vertical surface (side) of the first variant of the chip faces a corresponding vertical surface of the second variant of the chip. A circuit on the first variant of the chip is electrically connected to a corresponding circuit on the second variant of the chip.

1 Claim, 5 Drawing Sheets

ENHANCED ARCHITECTURAL INTERCONNECT OPTIONS ENABLED WITH FLIPPED DIE ON A MULTI-CHIP PACKAGE

FIELD OF THE INVENTION

This invention relates generally to interconnection of chips (die) on multi-chip packages.

SUMMARY OF EMBODIMENTS OF THE INVENTION

Many modern electronic systems, such as computers, use multiple instances of a particular chip. For example, two instances of a processor chip may be used and must be interconnected on a carrier.

Prior art FIGS. 1A and 1B show examples of conventional interconnection between two instances of a particular chip having a Bus X I/O (drivers and/or receivers) and a Bus Y I/O (drivers and/or receivers).

FIG. 1A shows a first conventional layout having a first instance and a second instance of the chip, a corresponding edge accentuated with a bold arrow for explanation, having Bus X I/O interconnected with Bus X on a carrier (a "carrier", for examples, may be a multi-chip module, a printed wiring board, or a silicon-on-silicon carrier), and Bus Y I/O interconnected with Bus Y on the carrier. The first and second instances of the chip are shown to have the same orientation on the carrier. Bus X interconnection (wiring) requires crossing wires as shown. Bus Y requires relatively long wiring, as shown, with Bus Y passing substantially an entire width of the second instance of the chip.

FIG. 1B shows a second conventional layout having a first instance and a second instance of the chip, the second instance of the chip being rotated 180 degrees relative to the first instance of the chip. As in FIG. 1A, a bold arrow accentuates a corresponding edge on the first and second instances of the chip. Bus X no longer requires that wires in Bus X cross; however, wires in Bus X are relatively long, having to pass substantially under the entire second instance of the chip. Typically, routing wires under an entire width of a chip is undesirable, since wiring channels under a chip are needed to route wires to/from the chip. Furthermore, although wires in Bus Y may be shorter in the second layout than in the first layout, wires in bus Y must cross. Note that although each of the exemplary eight wires of Bus Y in FIG. 1B are shown as "straight wires" for simplicity of drawing, it is understood that vias and a plurality of wiring planes in the carrier would be used in practice and that portions of each wire in Bus Y on different wiring planes would be connected by vias. Crossing of a large number of signal conductors, e.g., a 64-bit bus, in a small area is a difficult problem and requires a number of wiring layers in the carrier and a number of vias in the carrier, resulting in higher costs of the carrier and degraded signal integrity of high speed signals passing between the first and second instances of the chip.

Many modern semiconductor chips include through-silicon vias (TSVs) that provide electrical connection between a first side of a chip and a second side of the chip. For example, U.S. Pat. No. 5,399,898, "Multi-Chip Semiconductor Arrangement Using Flip Chip Dies" teaches of "double-sided flip chips provide raised bump contact means on both major surfaces of a die and feed through connections between contacts on opposite sides of the die . . . ". U.S. patent application Ser 11/833,112, assigned to the present assignee, and filed Aug. 2, 2007, teaches of a "small area, robust silicon via structure and process", wherein "'Through Silicon Via' (TSV) interconnection technology is used for machining these high density memory chip packages. This technique involves creating vertical connections through the stacked chips . . . . These micron-sized holes penetrate through the silicon vertically to connect circuits directly to the processor. The addition of the vertical interconnections creates a three-dimensional interconnect." "3D Chip Stacking Technology with Low-Volume Lead-Free Interconnections", by K Sakuma, et al, Electronic Components and Technology Conference 2007 ECTC '07 Proceedings 57th, May 29, 2007-Jun. 1, 2007, pages 627-632, further describes TSV technology and bonding considerations.

Embodiments of the present invention utilize TSV vertical interconnections between a first surface (i.e., the surface of the chip having circuits in a circuitry region) of a chip and a second surface (e.g., the surface of the chip opposite the first surface) of the chip. The chip is designed having two chip variants as discussed below.

A first variant of the chip has connectors (e.g., wire bond or bump connections) on the first surface. The first variant of the chip is called a front side connected chip.

A second variant of the chip has wire bond or bump connections on the second surface of the second variant of the chip. The second variant of the chip is called a back side connected chip.

The first variant of the chip (front side connected chip) is attached to a carrier (for examples, a printed circuit board, a silicon carrier, or a multi-chip module), with electrical connections made to the connections on the first surface of the first variant of the chip. The second variant of the chip (back side connected chip) is attached to the carrier with electrical connections made to the connections on the second surface of the second variant of the chip.

The front side connected chip and the back side connected chip have the same circuits in the circuitry region, being variants of the same chip. I/O circuits in the circuitry region (drivers and/or receivers) are connected to TSVs so that I/O circuits are connected to respective wire bond or bump connections on the first surface of the front side connected chip, or to respective wire bond or bump connections on the second surface of the back side connected chip. Although the front side connected chip and the back side connected chip share the same function and have the same circuitry in the circuitry region, the front side connected chip and the back side connected chip are distinct variants and therefore require different identification, such as part numbers, because the wire bond or bump patterns are different and not interchangeable.

In many applications a chip has a bus comprising a relatively large number of signal conductors that need to communicate with another chip of the same logic design. For example, two processor chips may need to communicate with each other over a high bandwidth processor bus. For a second example, two processor chips may need to "dot" onto a processor memory bus (that is, one of the two processor chips may drive the processor memory bus at a given time or receive data from a memory at another given time). Interconnection should be as short as possible, and long "wiring stubs" are undesirable for signal integrity reasons. Long wiring paths on a carrier, such as a multi-chip module or a printed wiring board often require additional wiring layers on the carrier, adding to cost of the carrier. Wiring a number of signal conductors that must cross, such as are shown in Bus X in FIG. 1A or Bus Y in FIG. 1B also may force additional wiring layers in the carrier, as well as vias to connect portions of a signal conductor on different wiring layers. Vias are undesirable from a signal integrity standpoint, since they introduce discontinuities of impedance on the signal conductor path.

In a method embodiment of the invention, a first variant of a chip is attached to a carrier. A second variant of the chip is attached to the carrier, the second variant of the chip being inverted relative to the first variant of the chip. A vertical surface (side) of the second variant of the chip facing a corresponding vertical surface (side) of the first variant of the chip.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Figure 1A:
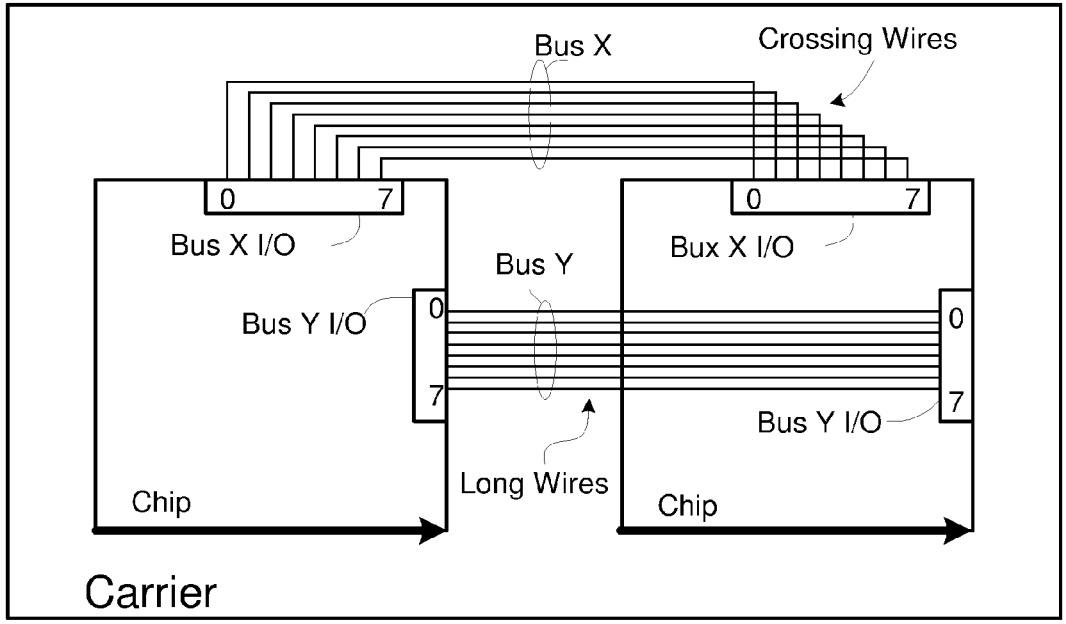
FIG. 1A is a prior art drawing of two instances of a chip mounted on a carrier, with corresponding bits of I/Os on the two instances of the chip connected together. The two chips are mounted on the carrier in the same orientation.
Figure 1B:
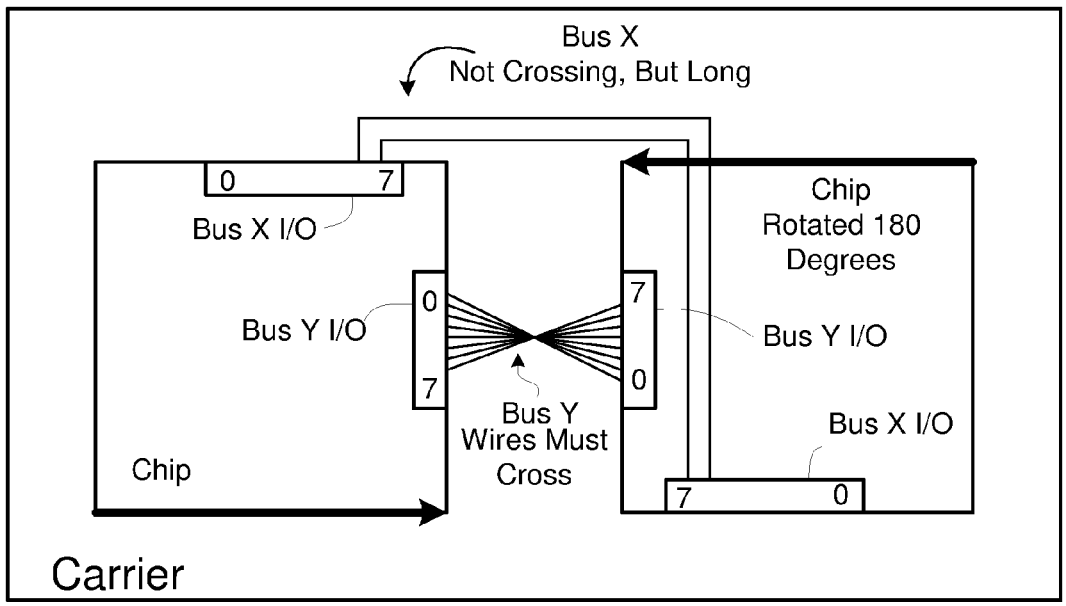
FIG. 1B is a prior art drawing of two instances of a chip mounted on a carrier, with corresponding bits of I/Os on the two instances of the chip connected together. A second instance of the chip is oriented 180 degrees on the carrier relative to the first instance.
Figure 2A:
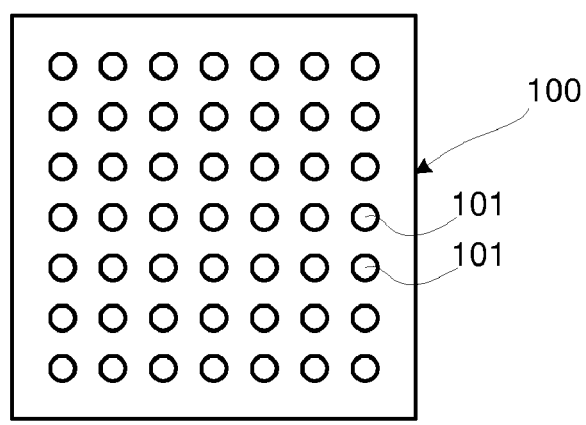
FIG. 2A shows a chip having bump connections.
Figure 2B:
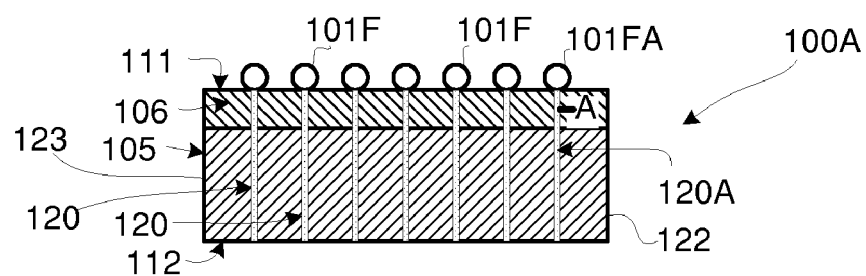
FIG. 2B is cross sectional view of a first variant of the chip of FIG. 2A in which the bump connections are made on a first surface of the chip, the first surface of the chip adjacent to a circuitry region in which circuits (e.g., field effect transistors, and on-chip wiring interconnect levels are placed).
Figure 2C:
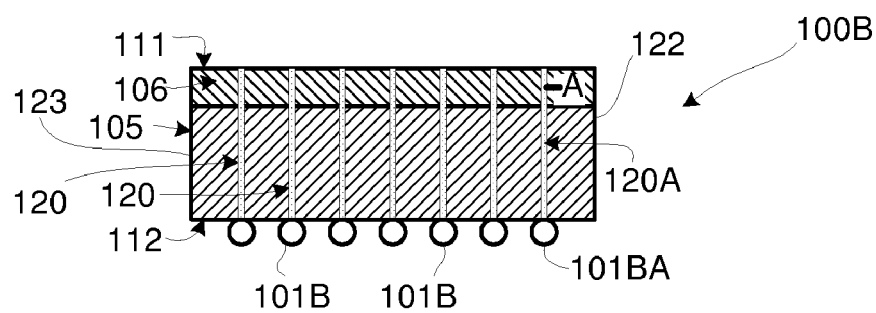
FIG. 2C is a cross sectional view of a second variant of the chip of FIG. 2a in which the bump connections are made on a second surface of the chip, the second surface of the chip opposite the first surface of the chip. The bump connections on the second surface of the chip are connected to circuitry in the circuitry region by through silicon vias (TSVs).

With reference now to the drawings, and, in particular, FIGS. 2A, 2B, and 2C, a semiconductor chip 100 is depicted. Chip 100 has two variants, chip 100A shown in FIG. 2B and chip 100B shown in FIG. 2C.

FIG. 2A shows a top view of semiconductor chip 100 having connection 101. For exemplary purposes, connections 101 are depicted as bump connections such as solder ball connections, however, wire bond connections suitable for attachment of wire bonds, or other suitable connectors are contemplated. For simplicity, only two connections 101 are referenced in FIG. 2A.

FIG. 2B shows a cross sectional view of a first variant of chip 100, referenced chip 100A. Chip 100A comprises a semiconductor substrate 105 having a first surface 111 and a second surface 112. Chip 100A further comprises a circuitry region 106 that further comprises circuitry (e.g., field effect transistors (FETs), resistors, on-chip wiring, and the like). Circuitry region 106 of chip 100A is nearer first surface 111 than surface 112, and in typical implementations, is adjacent to first surface 111 (with, in some embodiments, dielectric insulation between circuitry region 106 and first surface 111). Chip 100A further comprises a plurality of TSV 120 (for simplicity, only two TSV 120 are referenced, plus a particular TSV 120 variant, TSV 120A, that is connected to a particular circuit, A). Chip 100A has a plurality of connections 101F attached to surface 111 of chip 100A, for simplicity, only two connectors 101F, plus a particular connector 101F, designated 101FA that is connected to circuit A, are referenced. Chip 100A is a front side connection chip; connections 101 on chip 100A are therefore denoted connections 101F (for front side). A particular circuit A in circuitry region 106 is shown connected to a particular TSV 120, denoted TSV 120A, and is routed to a particular connection 101, denoted 101FA. Chip 100A has a first vertical side 122 and a second vertical side 123.

FIG. 2C shows a cross sectional view of a second variant of chip 100, referenced chip 100B. Chip 100B is similar to chip 100A except that connections 101, denoted as 101B are attached to surface 112 of substrate 105, instead of being attached to surface 111 of substrate 105 as done with chip 100A. Chip 100B has the same circuitry in circuitry region 106, and has the same TSVs 120 as chip 100A. As shown in FIG. 2C, exemplary circuit A is connected to TSV 120A. TSV 120A, in chip 100B, carries signals to and/or from connection 101 BA. Other circuits (not shown) in circuitry area 106 of chip 100B likewise drive and/or receive signals carried by other TSV 120s connected to other connectors 101B. Chip 100B has first vertical side 122 and second vertical side 123 in the same relationship to circuitry (e.g., circuit A) as first vertical side 122 and second vertical side 123 on chip 100A. As before, chip 100B is the same as chip 100A excepting for where connections 101 (101F, 101B) are attached, and, of course, any processing details that must exist to accommodate connections on one surface of chip 100 in a front side connection version (chip 100A) and the opposite surface of chip 100 in a back side connection version (chip 100B). For example, such accommodations may include passivation coverings (not shown) of ends of TSVs 120 at surface 112 in chip 100A and passivation coverings (not shown) of ends of TSVs 120 at surface 111 in chip 100B.

Figure 3A:
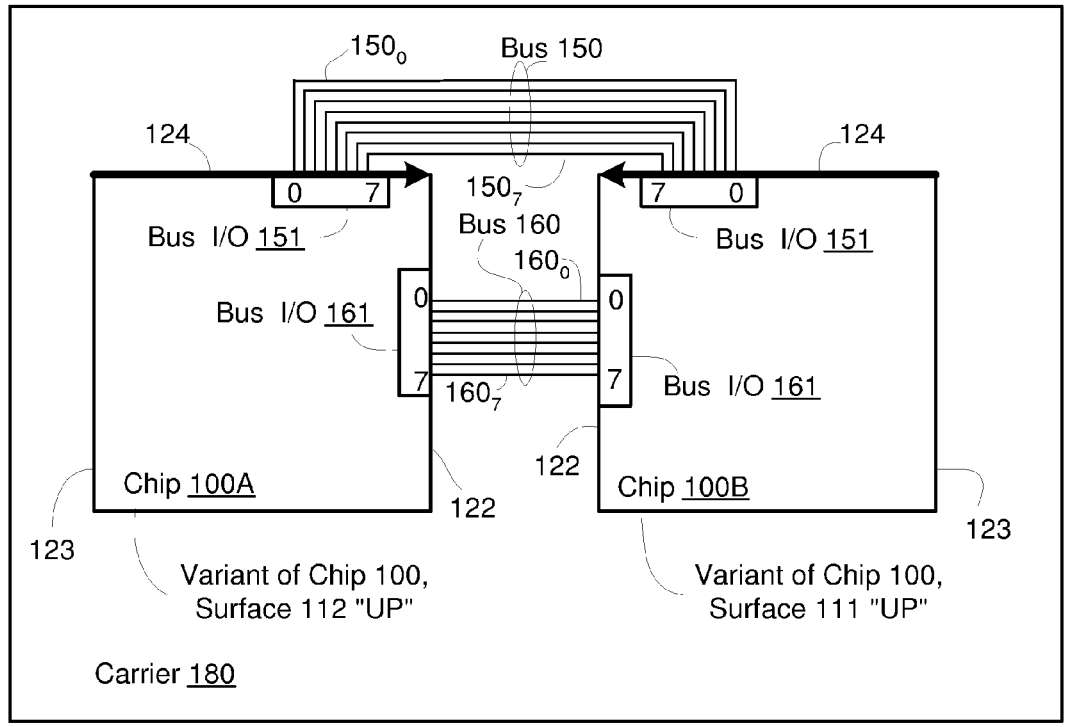
FIGS. 3A, 3B, and 3C show a top view (FIG. 3A) and cross section views (FIGS. 3B and 3C) of a carrier 180 having a front side connected chip 100A and a back side connected chip 100B.
Figure 3B:
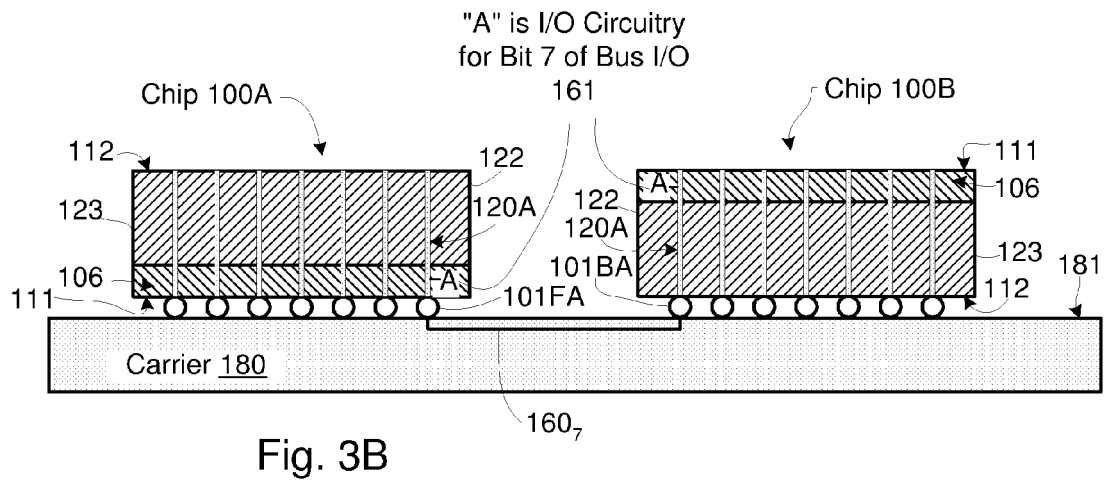
Figure 3C:
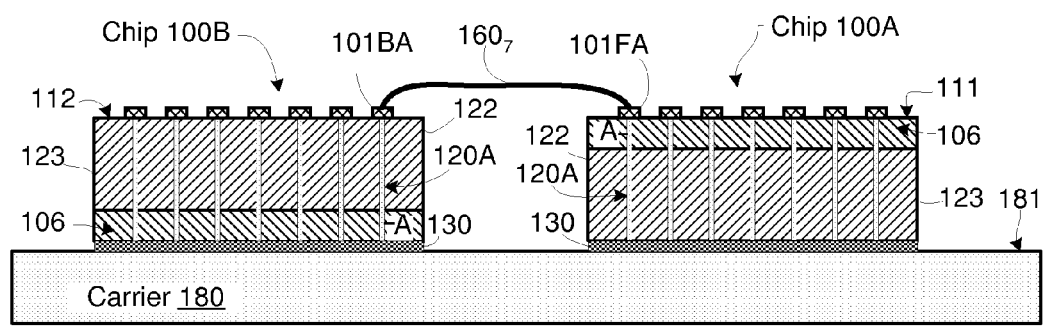

FIGS. 3A, 3B, and 3C illustrate a carrier 180 having attached a chip 100A and a chip 100B.

As explained earlier, chip 100A and chip 100B are both variants of the same chip 100. Chip 100A has connections on a first surface 111 and is called a front side connection chip. Chip 100B has connections on a second surface 112 and is called a back side connection chip.

Chip 100A and chip 100B each have a first vertical side 122, vertical side 122 being closer to a particular circuit A, than a second vertical side 123 on chips 100A and 100B. Chip 100A and chip 100B each have a third vertical side 124, identified in FIG. 3A. Third vertical side 124 is accentuated with a bold arrow on chips 100A and 100B in FIG. 3A to more clearly show side 124 as well as to clearly show the relative orientations of chips 100A and 100B. Chip 100B is inverted (flipped) relative to Chip 100A and oriented such that a vertical side (vertical side 122) of chip 100A faces a corresponding vertical side (vertical side 122) of chip 100B.

For purposes of explanation, chips 100A and 100B are interconnected by bus 150, further comprising signal conductors $150_0$-$150_7$. Signal conductors in Bus 150 are connected to bus I/O 151 circuits that are shown to be at or near side 124 on chips 100A and 100B. Whereas many chips 100 are designed with I/O circuits such a bus I/O 151 circuits physically adjacent to vertical sides (e.g., vertical side 124) of a chip, "near" may include any circuit nearer the specified vertical side of the chip than an opposite vertical side of the chip.

Chips 100A and 100B are further interconnected by bus 160, further comprising signal conductors $160_0$-$160_7$. Signal conductors in Bus 160 are connected to Bus I/O 161 circuits that are shown to be at or near side 122 of chips 100A and 100B.

It is understood that interconnection of chips 100A and 100B by way of bus 150 and bus 160 are for explanatory purposes only to describe two examples of busses that are easily implemented in embodiments of the invention.

Chip 100A is attached to carrier 180 in a first orientation. As shown in FIGS. 3A and 3B, the first orientation has first surface 111 facing a top surface 181 of carrier 180. First vertical side 122 of chip 100A is on the right side of chip 100A as depicted in FIGS. 3A and 3B.

Chip 100B is attached to carrier 180 in a second orientation. Chip 100B is inverted ("upside down") with respect to chip 100A, having second surface 112 facing the top surface 181 of carrier 180. Chip 100B is placed on carrier 180 such that a vertical side of chip 100B faces a corresponding vertical side of chip 100A. As shown in FIGS. 3A and 3B, the corresponding sides are vertical sides 122 on chips 100A and 100B.

FIG. 3B shows an exemplary circuit A in circuitry region 106 on chips 100A and 100B. Circuit A on chip 100A is shown connected to TSV 120A on chip 100A, routed through connector 101FA on chip 100A, through signal conductor $160_7$ on carrier 180 to connector 101 BA on chip 100B to TSV 120A on chip 100B. TSV 120A on chip 100B connects connector 101 BA to circuit A in circuitry region 106 of chip 100B.

Bus 160 in FIGS. 3A and 3B is short (distance between corresponding vertical surface (sides) 122, plus distances to the associated connectors 101), since Bus I/O 161 is at or near vertical side 122 of chip 100 (chip 100 variants 100A and 100B), and side 122 on chip 100A and 100B face each other. None of the signaling conductors in Bus 160 must cross another signaling conductor in Bus 160.

As shown in FIG. 3A, none of the signal conductors in Bus 150 must cross another signaling conductor in Bus 150.

FIG. 3C shows an example of a wire bond implementation. Corresponding referenced items are as shown and described with reference to FIGS. 3A and 3B. Chips 100A and 100B are attached to carrier 180 using an adhesive 130. Connectors 101 (only connectors 101FA and 101BA are referenced) are wire bond connectors. Interconnection between connectors 101 near a vertical side (e.g., vertical side 122) of chip 100A and chip 100B may be "wire bonded" without using signal conductors on carrier 180. For example, signal conductor $160_7$ is shown in the cross sectional view of FIG. 3C as a wire bond signal conductor, instead of a signal conductor in carrier 180 as shown in FIG. 3B.

Figure 4:
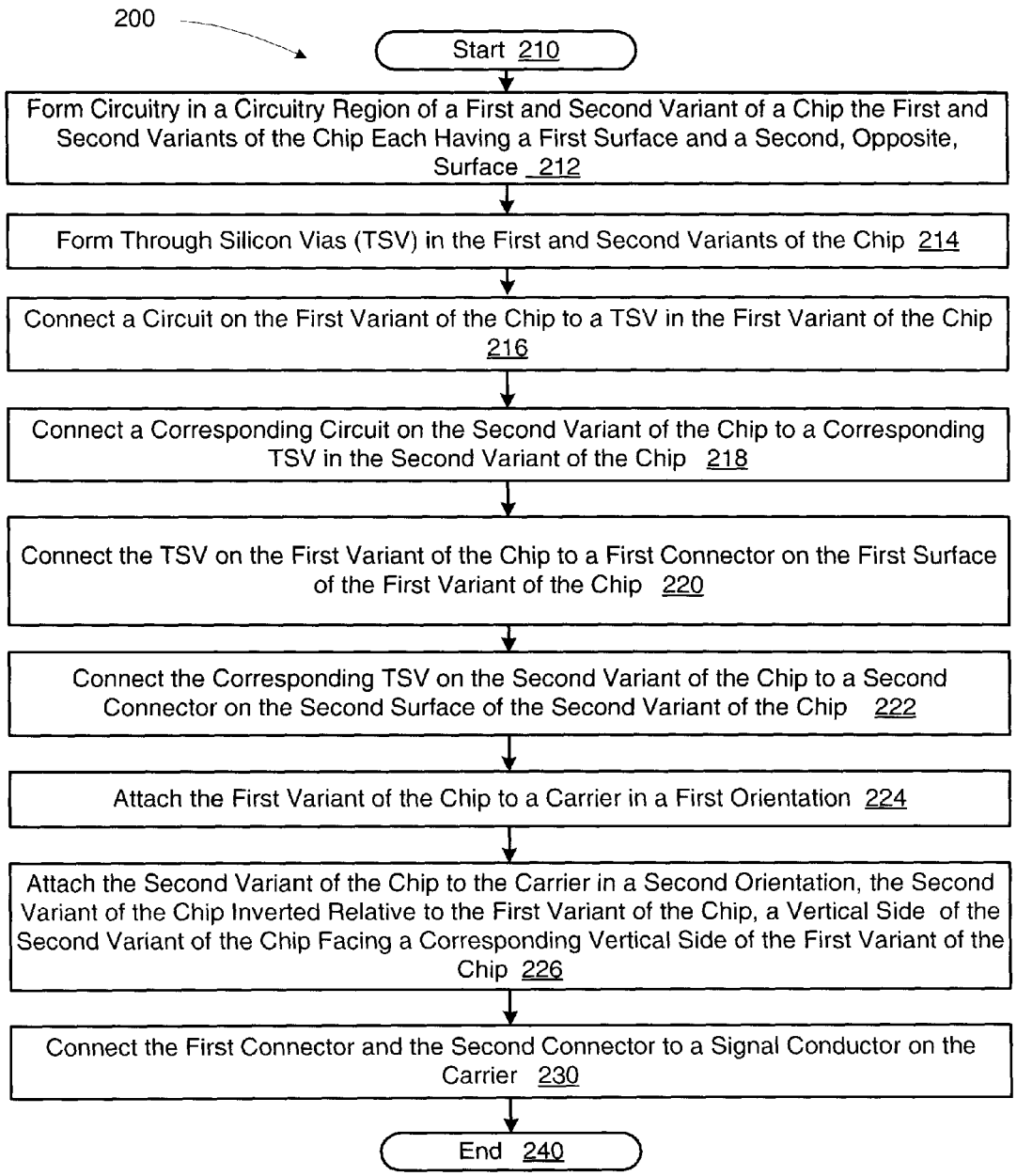
FIG. 4 is a flow chart of a method embodiment of this invention.

FIG. 4 is a flow chart of a method 200 embodiment of the invention. Method 200 begins at block 210.

In block 212, circuitry (e.g., FETs, resistors, capacitors, on-chip wiring and associated insulators) is formed in a first and second variant of a semiconductor chip in a circuitry region of the semiconductor chip at or near a first surface of the first and second variant of the semiconductor chip. In general, a first silicon wafer will be manufactured having only first variants of the chip, and a second silicon wafer will be manufactured having only second variants of the chip.

In block 214, through silicon vias (TSVs) are formed through the silicon substrates of the first and second variants of the chip. The TSVs are electrically conducting vias that extend from the first surface of the chip to a second, opposite, surface of the chip.

In block 216, a circuit on the first variant of the chip is connected to a TSV on the first variant of the chip, using a conducting material in the circuitry area of the second variant of the chip. The conducting material may be a metal (copper, aluminum, or other suitable metal compatible with the chip manufacturing technology), polysilicon, semiconductor diffusion/implant area, or other conducting material available in any particular chip manufacturing process.

In block 218, the corresponding circuit on the second variant of the chip is connected to a corresponding TSV on the second variant of the chip, using a conducting material in the circuitry area of the second variant of the chip.

In block 220, a first connector (e.g., wire bond or bump connector) is placed on the first surface of the first variant of the chip and electrically connected to the TSV on the first variant of the chip, thereby connecting the circuit on the first variant of the chip to the first connector.

In block 222, a second connector (e.g., wire bond or bump connector) is placed on the second surface of the second variant of the chip and connected to the corresponding TSV on the second variant of the chip, thereby connecting the circuit on the second variant of the chip to the second connector.

In block 224, the first variant of the chip is attached to a carrier (e.g., a multi-chip module, a printed wiring board, or a silicon carrier) in a first orientation.

In block 226, the second variant of the chip is attached to the carrier in a second orientation, the second orientation being inverted ("flipped") relative to the first orientation; a vertical surface (side) of the first variant of the chip facing a corresponding vertical surface (side) of the second variant of the chip.

In block 230, the first connector and the second connector are electrically connected. The connection may be done using a signal conductor in or on the carrier, or by use of wire bond interconnection.

Method 200 ends at block 240.

What is claimed is:

1. An apparatus comprising:
   a carrier for attaching chips;
   a first chip comprising:
     a first circuit in a first circuitry region, the first circuitry region being nearer a first surface of the first chip than to a second surface of the first chip, the second surface of the first chip opposite to the first surface of the first chip;
     a first connector on the first surface of the first chip, the first connector connected to the first circuit;
   a second chip comprising:
     a second circuit in a second circuitry region, the second circuitry region being nearer to a first surface of the second chip corresponding to the first surface of the first chip than to a second surface of the second chip, the second surface of the second chip opposite to the first surface of the second chip, the second circuit being identical to the first circuit;
   a second connector on the second surface of the second chip, the second connector connected to the circuit in the second circuitry region of the second chip by a through silicon via (TSV);
   the first chip attached to the carrier by the first connector;
   the second chip inverted relative to the first chip and attached to the carrier by the second connector; and
   a conductor on the carrier connecting the first and second connectors.

* * * * *